US012581614B2

(12) United States Patent
He et al.

(10) Patent No.: US 12,581,614 B2
(45) Date of Patent: Mar. 17, 2026

(54) METHOD AND APPARATUS FOR AN AUTOMATIC BATTERY HEAT SINKING OPERATION CONTROL MECHANISM

(71) Applicant: Dell Products, LP, Round Rock, TX (US)

(72) Inventors: Qinghong He, Austin, TX (US); John Lerma, Cedar Park, TX (US); Travis C. North, Cedar Park, TX (US)

(73) Assignee: DELL PRODUCTS LP, Round Rock, TX (US)

( * ) Notice: Subject to any disclaimer, the term of this patent is extended or adjusted under 35 U.S.C. 154(b) by 815 days.

(21) Appl. No.: 17/972,028

(22) Filed: Oct. 24, 2022

(65) Prior Publication Data

US 2024/0138099 A1     Apr. 25, 2024
US 2024/0237271 A9     Jul. 11, 2024

(51) Int. Cl.
*H05K 7/20* (2006.01)
*G06F 1/20* (2006.01)

(52) U.S. Cl.
CPC ......... *H05K 7/20154* (2013.01); *G06F 1/206* (2013.01); *H05K 7/20209* (2013.01); *H05K 7/2039* (2013.01)

(58) Field of Classification Search
USPC .......................... 320/148, 149, 150, 151, 152
See application file for complete search history.

(56) References Cited

U.S. PATENT DOCUMENTS 5,070,427 A     12/1991 Bush
7,476,455 B2     1/2009 Edlund 9,982,661 B1     5/2018 Trigwell
10,866,036 B1     12/2020 Busche
11,204,206 B2     12/2021 Busche
2005/0007068 A1*     1/2005 Johnson ................ H02J 7/0045
                                                            320/110
2006/0066434 A1     3/2006 Richards (Continued)

FOREIGN PATENT DOCUMENTS

CN     116646641 B  *  9/2024  ................ B64F 1/36
EP     1568054 A2     8/2005

(Continued)

*Primary Examiner* — Brian Ngo

(74) *Attorney, Agent, or Firm* — Prol Intellectual Property Law, PLLC; H. Kenneth Prol

(57) ABSTRACT

An information handling system includes a processor, a memory device, a PMU to provide power to the processor and memory device, and a battery operatively coupled to the PMU. The information handling system also includes a controlled battery heat sink cooling system, the battery heat sink cooling system including a heat distribution plate thermally coupled to a surface of the battery, a heat pipe operatively coupled to a first side of the heat distribution plate, the heat pipe operatively coupled to heat generating hardware component within the information handling system to conduct heat from the heat generating hardware component to the heat distribution plate, a spring operatively coupled to the heat distribution plate to produce a force to urge the heat distribution plate to thermally couple to the battery, and a thermal switch operatively coupled to a second side of the heat distribution plate to, when heated to a temperature threshold, expand to thermally de-couple the heat distribution plate from the battery.

20 Claims, 5 Drawing Sheets

(56) References Cited

U.S. PATENT DOCUMENTS

2011/0215767 A1 * 9/2011 Johnson ................ H01M 50/20
320/136
2022/0294050 A1 9/2022 Salim Shirazy

FOREIGN PATENT DOCUMENTS

| JP | 4593772 | B2 * | 12/2010 | .......... H01M 50/516 |
| TW | 1295118 | B * | 3/2008 | |
| WO | 2016/192052 | A1 | 12/2016 | |
| WO | 2021/236386 | A1 | 11/2021 | |

* cited by examiner

METHOD AND APPARATUS FOR AN AUTOMATIC BATTERY HEAT SINKING OPERATION CONTROL MECHANISM

FIELD OF THE DISCLOSURE

The present disclosure generally relates to cooling systems for information handling system. The present disclosure more specifically relates to heat sinks to a battery used to cool an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. Under various operating conditions, especially high-performance conditions, information handling systems may generate heat which, if not mitigated, may affect performance. The information handling system may thus include a cooling system used to cool hardware therein such as a processing device.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
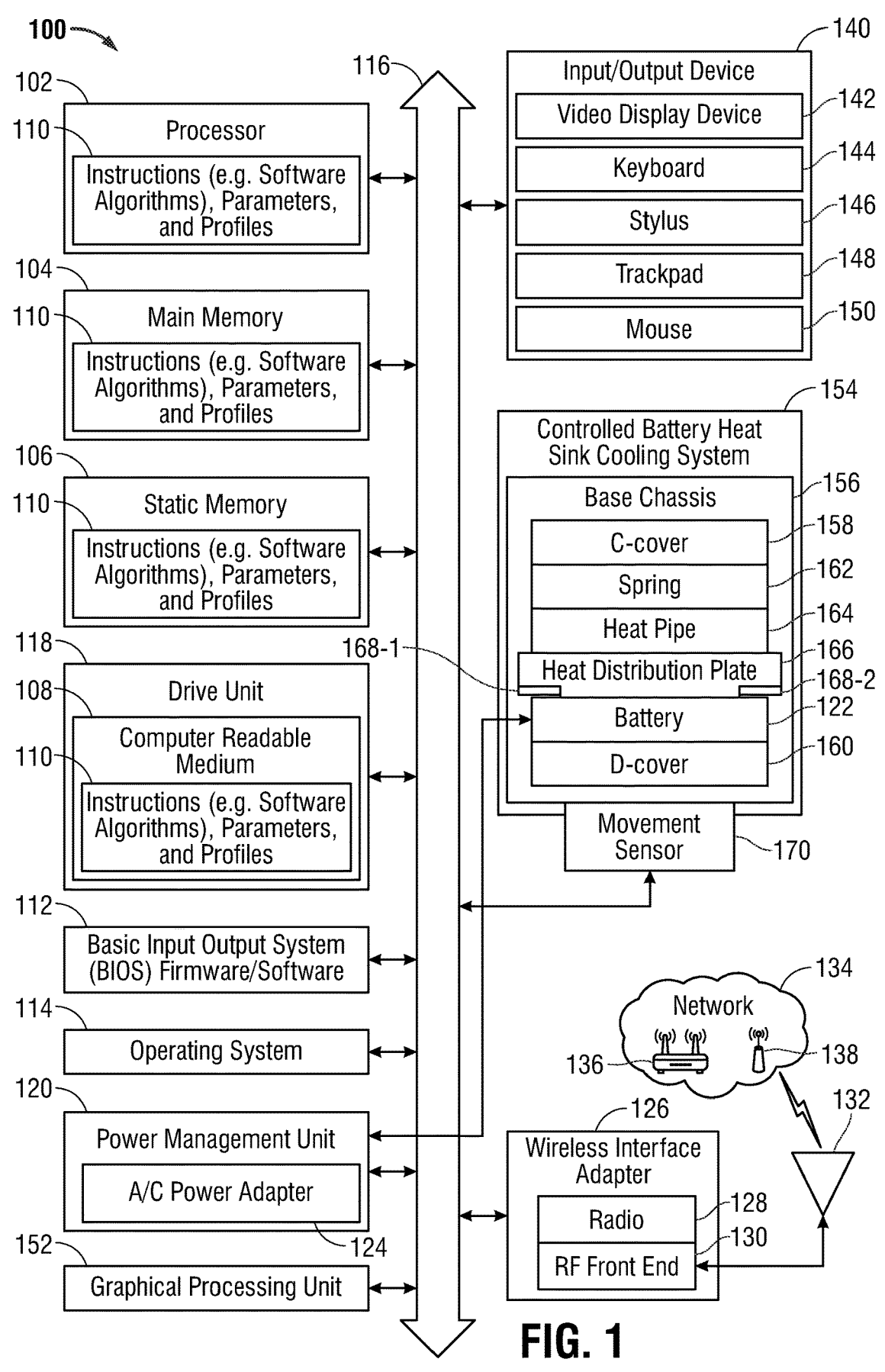
FIG. 1 is a block diagram of an information handling system including a cooling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Information handling systems operate to provide computing, data storage, and application resources among other computing resources. The hardware used to provide these resources to the user consume electricity. As a result of the consumption of this electricity, heat is produced within the housing or other structures used to house the hardware. Some information handling systems include a fan used to blow heat from within the housing to a vent to vent the heated air from within the housing. However, these fans may not be capable of sufficiently reduce the heat accumulating within a housing of the information handling system or may cause undesirable noise.

In laptop-type information handling systems, for example, a battery may take up a significant portion within the housing sometimes as much as 50% of the available space within the housing. The present specification uses the battery as a thermal mass that can be used to absorb thermal energy created by operating hardware generating heat within the housing such as a processing device. Using the battery as a heat sink, however, may reduce the battery cycle life if the battery is subjected to significantly high temperatures. For example, this may be due to an irreversible formation of a binder layer at a positive electrode surface of the battery at consistently higher temperatures.

The present specification describes an information handling system that during operation may create heat due to its operation. The information handling system may further include a memory device and a power management unit (PMU) to provide power to any hardware processors or memory devices. Still further, the information handling system may further include a controlled battery heat sink cooling system that includes a heat distribution plate placed against a surface of a battery operatively coupled to the PMU. In an embodiment, a heat pipe is operatively coupled to a first side of the heat distribution plate at a first end of the heat pipe with a second end of the heat pipe operatively coupled to heat generating hardware component within the information handling system such as a hardware processor. The heat pipe may conduct heat from the heat generating hardware component to the heat distribution plate. In an embodiment, the controlled battery heat sink cooling system includes a spring operatively coupled to the heat pipe to produce a force against the heat pipe and the heat distribution plate and towards the battery for the heat distribution plate to be urged into thermal contact with the battery. In a further embodiment, a thermal switch is operatively coupled to a second side of the heat distribution plate to, when heated to a temperature threshold, expand to thermally disengage or decouple the heat distribution plate from the battery providing temperature-controlled battery heat sinking.

In an embodiment, the thermal switch is a paraffin wax bag. The paraffin wax may be maintained in a plastic or metal (e.g., aluminum) bag that is allowed to expand. Again, in an embodiment, the paraffin wax may be formulated to melt at a specific temperature threshold such as a temperature of around 50° C. or another temperature threshold at which damage or wear to a battery may occur. When such a threshold temperature is reached, the paraffin wax expands which, in turn, thermally disengages the heat distribution plate from off a surface of the battery. In an embodiment, the paraffin wax bag may expand to around 15% of its solid state when the threshold temperature is reached. This prevents damage or wear to the battery from overheating while, when the threshold temperature is not reached, allowing the controlled battery heat sink cooling system to use the battery as a heat sink from the heat pipe. Much of the time, the information handling system will operate below the temperature threshold.

In an embodiment, the thermal switch may include a shape-memory alloy that changes shape when the shape-memory alloy reaches the temperature threshold. In an embodiment, the threshold temperature may be a temperature of around 50° C. The change in shape of the shape-memory alloy thermally disengages the heat distribution plate from off a surface of the battery. Again, this prevents damage to the battery from overheating while, when the threshold temperature is not reached, allowing the battery heat sink cooling system to use the battery as a heat sink from the heat pipe when below the temperature threshold.

FIG. 1 illustrates an information handling system 100 similar to information handling systems according to several aspects of the present disclosure that is operatively couplable to a cooling system formed within a housing of the information handling system. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a convertible laptop, a tablet, a smartphone, a communications device, an access point (AP), a base station transceiver, a wireless telephone, a control system, a camera, a scanner, a printer, a personal trusted device, a web appliance, or any other suitable machine capable of executing a set of machine-readable code instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the computer system 100 can be implemented using electronic devices that provide voice, video, or data communication. For example, an information handling system 100 may be any mobile or other computing device capable of executing a set of machine-readable code instructions (sequential or otherwise) that specify actions to be taken by that machine. In an embodiment, the information handling system 100 may be operatively coupled to a server or other network device as well as with any wireless peripheral devices. Further, while a single information handling system 100 is illustrated, the term "system" shall also be taken to include any collection of systems or sub-systems that individually or jointly execute a set, or multiple sets, of machine-readable code instructions to perform one or more computer functions.

The information handling system 100 may include memory (volatile (e.g., random-access memory, etc.), non-volatile (read-only memory, flash memory etc.) or any combination thereof), one or more hardware processing resources, such as a central processing unit (CPU), a graphics processing unit (GPU) 152, a hardware controller, or any combination thereof. Additional components of the information handling system 100 can include one or more storage devices, one or more communications ports for communicating with external devices, as well as various input and output (I/O) devices 140, such as a keyboard 144, a mouse 150, a video display device 142, a stylus 146, a trackpad 148, or any combination thereof. The information handling system 100 can also include one or more buses 116 operable to transmit data communications between the various hardware components described herein. Portions of an information handling system 100 may themselves be considered information handling systems and some or all of which may be wireless.

Information handling system 100 can include devices or modules that embody one or more of the devices or execute machine-readable code instructions for the one or more systems and modules described above, and operates to perform one or more of the methods described herein. For example, machine-readable code instructions may be executed by a PMU controller or other hardware processing resource for a battery heat sink cooling control system to control the controlled battery heat sink cooling system 154 of embodiments herein. The information handling system 100 may execute machine-readable code instructions 110 via processing resources that may operate on servers or systems, remote data centers, or on-box in individual client information handling systems according to various embodiments herein. In some embodiments, it is understood any or all portions of machine-readable code instructions 110 may operate on a plurality of information handling systems 100.

The information handling system 100 may include hardware processing resources such as a hardware processor 102, a CPU, accelerated processing unit (APU), a neural processing unit (NPU), a vision processing unit (VPU), an embedded controller (EC), a digital signal processor (DSP), a GPU 152, a microcontroller, or any other type of hardware processing device that executes machine-readable code instructions to perform some of the processes described herein. Any of the hardware processing resources may operate to execute code that is either firmware or software code. As described herein, the operation of these types of processing resources may create heat within a housing of the information handling system 100. Moreover, the information handling system 100 can include memory such as main memory 104, static memory 106, computer readable medium 108 storing machine-readable code instructions 110 of, in an example embodiment, a controlled battery heat sink cooling controller system, or other computer executable program code, and drive unit 118 (volatile (e.g., random-access memory, etc.), nonvolatile (read-only memory, flash memory etc.) or any combination thereof).

As shown, the information handling system 100 may further include a video display device 142. The video display device 142, in an embodiment, may function as a liquid crystal display (LCD), an organic light emitting diode (OLED), a flat panel display, or a solid-state display. Although FIG. 1 shows a single video display device 142, the present specification contemplates that multiple video display devices 142 may be used with the information handling system 100 to facilitate an extended desktop scenario, for example. Additionally, the information handling system 100 may include one or more input/output devices 140 including an alpha numeric input device such as a keyboard 144 and/or a cursor control device, such as a mouse 150, touchpad/trackpad 148, a stylus 146, or a gesture or touch screen input device associated with the video display device 142 that allow a user to interact with the images, windows, and applications presented to the user. In an embodiment, the video display device 142 may provide output to a user that includes, for example, one or more windows describing one or more instances of applications being executed by the hardware processor 102 of the information handling system. In this example embodiment, a window may be presented to the user that provides a graphical user interface (GUI) representing the execution of that application.

The network interface device of the information handling system 100 shown as wireless interface adapter 126 can provide connectivity among devices such as with Bluetooth® or to a network 134, e.g., a wide area network (WAN), a local area network (LAN), wireless local area network (WLAN), a wireless personal area network (WPAN), a wireless wide area network (WWAN), or other network. In an embodiment, the WAN, WWAN, LAN, and WLAN may each include an access point 136 or base station 138 used to operatively couple the information handling system 100 to a network 134. In a specific embodiment, the network 134 may include macro-cellular connections via one or more base stations 138 or a wireless access point 136 (e.g., Wi-Fi or WiGig), or such as through licensed or unlicensed WWAN small cell base stations 138. Connectivity may be via wired or wireless connection. For example, wireless network access points 136 or base stations 138 may be operatively connected to the information handling system 100. Wireless interface adapter 126 may include one or more radio frequency (RF) subsystems (e.g., radio 128) with transmitter/receiver circuitry, modem circuitry, one or more antenna front end circuits 130, one or more wireless controller circuits, amplifiers, antennas 132 and other circuitry of the radio 128 such as one or more antenna ports used for wireless communications via multiple radio access technologies (RATs). The radio 128 may communicate with one or more wireless technology protocols. In and embodiment, the radio 128 may contain individual subscriber identity module (SIM) profiles for each technology service provider and their available protocols for any operating subscriber-based radio access technologies such as cellular LTE communications.

In an example embodiment, the wireless interface adapter 126, radio 128, and antenna 132 may provide connectivity to one or more of the peripheral devices that may include a wireless video display device 142, a wireless keyboard 144, a wireless mouse 150, a wireless headset, a microphone, a wireless stylus 146, and a wireless trackpad 148, among other wireless peripheral devices used as input/output (I/O) devices 140.

The wireless interface adapter 126 may include any number of antennas 132 which may include any number of tunable antennas for use with the system and methods disclosed herein. Although FIG. 1 shows a single antenna 132, the present specification contemplates that the number of antennas 132 may include more or less of the number of individual antennas shown in FIG. 1. Additional antenna system modification circuitry (not shown) may also be included with the wireless interface adapter 126 to implement coexistence control measures via an antenna controller in various embodiments of the present disclosure.

In some aspects of the present disclosure, the wireless interface adapter 126 may operate two or more wireless links. In an embodiment, the wireless interface adapter 126 may operate a Bluetooth® wireless link using a Bluetooth® wireless or Bluetooth® Low Energy (BLE). In an embodiment, the Bluetooth® wireless protocol may operate at frequencies between 2.402 to 2.48 GHz. Other Bluetooth® operating frequencies such as Bluetooth® operating frequencies such as 6 GHz are also contemplated in the presented description. In an embodiment, a Bluetooth® wireless link may be used to wirelessly couple the input/output devices operatively and wirelessly including the mouse 150, keyboard 144, stylus 146, trackpad 148, and/or video display device 142 to the bus 116 in order for these devices to operate wirelessly with the information handling system 100. In a further aspect, the wireless interface adapter 126 may operate the two or more wireless links with a single, shared communication frequency band such as with the 5G or Wi-Fi WLAN standards relating to unlicensed wireless spectrum for small cell 5G operation or for unlicensed Wi-Fi WLAN operation in an example aspect.

The wireless interface adapter 126 may operate in accordance with any wireless data communication standards. To communicate with a wireless local area network, standards including IEEE 802.11 WLAN standards (e.g., IEEE 802.11ax-2021 (Wi-Fi 6E, 6 GHz)), IEEE 802.15 WPAN standards, WWAN such as 3GPP or 3GPP2, Bluetooth® standards, or similar wireless standards may be used. Wireless interface adapter 126 may connect to any combination of macro-cellular wireless connections including 2G, 2.5G, 3G, 4G, 5G or the like from one or more service providers. Utilization of radio frequency communication bands according to several example embodiments of the present disclosure may include bands used with the WLAN standards and WWAN carriers which may operate in both licensed and unlicensed spectrums.

The wireless interface adapter 126 can represent an add-in card, wireless network interface module that is integrated with a main board of the information handling system 100 or integrated with another wireless network interface capability, or any combination thereof. In an embodiment the wireless interface adapter 126 may include one or more radio frequency subsystems including transmitters and wireless controllers for connecting via a multitude of wireless links. In an example embodiment, an information handling system 100 may have an antenna system transmitter for Bluetooth®, BLE, 5G small cell WWAN, or Wi-Fi WLAN connectivity and one or more additional antenna system transmitters for macro-cellular communication. The RF subsystems and radios 128 and include wireless controllers to manage authentication, connectivity, communications, power levels for transmission, buffering, error correction, baseband processing, and other functions of the wireless interface adapter 126.

As described herein, the information handling system 100 may include and be operatively coupled to a controlled battery heat sink cooling system 154. The controlled battery heat sink cooling system 154 may be part of, in an embodiment, a cooling system used to cool an interior housing of the information handling system. In an example embodiment, this laptop-type information handling system 100 includes a display housing having a back cover (e.g., an "a-cover") which serves as a back cover for the display housing and a "b-cover" which may include a bezel, if any, and a video display device 142 (e.g., display screen) of the information handling system. In an example embodiment, this laptop-type information handling system may have a chassis that forms a base chassis and includes a top cover (e.g., "c-cover" 158) housing, for example, a keyboard, touchpad/trackpad, and any cover in which these components are set. The base chassis may also include a bottom cover (e.g., a "d-cover" 160) housing, for example, a processing device (e.g., hardware processor 102), a memory (e.g., main memory 104, static memory 106, etc.), a power management unit (PMU) 120, wireless interface adapters 126 and other components of the information handling system 100 for this laptop-type information handling system. In an embodiment, the portions of the controlled battery heat sink cooling system 154 may be formed within the base chassis of the information handling system. Although the present specification describes the information handling system 100 as a laptop-type information handling system, the present specification further contemplates that the controlled battery heat sink cooling system 154 described herein may be used with other types of information handling systems such as a tablet computing system or others as described herein.

The controlled battery heat sink cooling system 154 includes a heat distribution plate 166 placed onto a surface of a battery 122. The battery 122 may be any type of battery used to provide power to the hardware associated with the information handling system 100. In an embodiment, the battery 122 may include one or more battery cells that each may be charged via a PMU 120 and A/C power adapter 124 for later discharge when the A/C power adapter 124 is not coupled to an A/C power source. In an embodiment, the size of the battery 122 may take up as much as 50% of the space within the base chassis 156 of the information handling system 100. The battery 122 has a large thermal mass and can absorb thermal energy with limited temperature rise. This allows the battery 122 to act as a heat sink into which heat generated from the hardware within the base chassis 156 to be conducted. However, the amount of heat conducted into the battery 122 may need to be limited so that the battery 122 is not damaged or worn from overheating.

The heat distribution plate 166 may be made of a material that can distribute heat over a portion of the surface of the battery 122 such as aluminum, copper, and the like. The heat distribution plate 166 may be operatively coupled to a first end of a heat pipe 164 on a first side of the heat distribution plate 166. This allows heat conducted by the heat pipe 164 from a heat generating hardware device within the base chassis 156 of the information handling system 100 to be conducted into the heat distribution plate 166 and, via thermal coupling, transferred into the battery 122.

Because the controlled battery heat sink cooling system 154 is placed between a battery and a chassis of the information handling system 100 such as a c-cover 158, the heat distribution plate 166 may be forced against a surface of the battery 122 for proper thermal coupling and heat distribution into the battery 122 in an embodiment. In an embodiment, a spring 162 may be used to urge or press the heat pipe 164 and heat distribution plate 166 to thermally couple with the surface of the battery 122. In an embodiment, a first end of the spring 162 may be operatively coupled to an interior surface of the c-cover 158 with a second end of the spring 162 pressing down onto the heat pipe 164 and/or heat distribution plate 166 via the mechanical energy stored in the spring 162.

As described herein, the temperature of the battery 122 may be kept below a threshold temperature so that the battery 122 is not damaged or worn by excessive heat conducted into it by the heat distribution plate 166. To prevent damage to the battery 122 and to lower the temperature of the battery 122 from exceeding this threshold temperature, the controlled battery heat sink cooling system 154 includes one or more thermal switches 168-1, 168-2. The thermal switch 168-1, 168-2 may be any device that physically disengages the heat distribution plate 166 and heat pipe 164 from thermal coupling with the surface of the battery 122. In an embodiment, the thermal switches 168-1, 168-2 may physically overcome the mechanical energy imparted by the spring 162 onto the heat pipe 164 and heat distribution plate 166 in order to physically lift the heat distribution plate 166 from thermal coupling with the surface of the battery 122. In an embodiment, the thermal switches 168-1, 168-2 have material properties that physically lift the heat distribution plate 166 off the battery 122 at or near the threshold temperature so that heat damage or wear does not occur at the battery 122.

In an embodiment, the thermal switches 168-1, 168-2 may be one or more paraffin wax bags. In an embodiment, the paraffin wax may be housed within a bag made of, for example, plastic or a metal such as aluminum. The paraffin wax bag may be operatively coupled to a second side (e.g., an underside) of the heat distribution plate 166 such that the paraffin wax bag is between a portion of the heat distribution plate 166 and the battery 122. In an embodiment, the paraffin wax within the paraffin wax bag may have a melting point at or near the threshold temperature such that the paraffin wax melts and increases its size. As the size of the paraffin wax increases, the paraffin wax bag may begin to lift the heat distribution plate 166 from thermal coupling with the surface of the battery 122 to thermally de-couple the battery 122 thereby limiting or preventing heat at the heat distribution plate 166 from being conducted into the battery 122. This prevents damage to the battery 122 while still allowing for heat to be conducted into the battery 122 when the temperature threshold is not reached. In an embodiment, the temperature threshold may be set to 50° C. (~122° F.) (±5°) to prevent damage to the battery 122 and the paraffin wax within the paraffin wax bags such as 168-1, 168-2 may be formulated to melt and expand at or near this temperature threshold. When the temperature at the heat distribution plate 166/battery 122 drops below the temperature threshold, the paraffin wax within the paraffin wax bag may solidify, coagulate, or otherwise return to its original and smaller state allowing the heat distribution plate 166 to be thermally coupled again onto the surface of the battery 122 via the spring 162. This allows heat to once again be conducted into the battery 122. In an embodiment, the threshold temperature may be set based on a cycle life target of the battery 122. For example, a threshold temperature may be based on a battery operating temperature below which an anticipated lifetime number of cycles (e.g., battery discharging and charging) that the battery 122 can provide is enabled based on the temperatures it is subjected to.

In an embodiment, the thermal switch or switches 168-1, 168-2 may be one or more shape-memory alloy structures that changes shape when heat is applied to it. In this embodiment, the shape-memory alloy may be made of any type of metal alloys such as copper-aluminum-nickel alloys and nickel-titanium alloys among others. These shape-memory alloys may, in an embodiment, be a two-way shape-memory alloy that has two different and stable shapes: one at a temperature below a threshold temperature and one above that threshold temperature. In an embodiment, this two-way shape-memory alloy may have a first shape at a temperature below the threshold temperature that allows the heat distribution plate 166 to come into contact with a surface of the battery 122 for thermal coupling. In an embodiment, this two-way shape-memory alloy may have a second shape at a temperature above the threshold temperature that raises the heat distribution plate 166 off from the surface of the battery 122 to thermally de-couple the battery 122. Again, in an embodiment, the alloys of the two-way shape-memory alloy may be selected to change from this first shape to the second shape at a threshold temperature of 50° C. (~122° F.) (±5°). This prevents excessive heat from damaging the battery 122 while allowing heat to be conducted into the battery 122 when the threshold temperature has not been reached. In an embodiment, the threshold temperature may be set based on a cycle life target of the battery 122. For example, a threshold temperature may be based on an anticipated lifetime number of cycles (e.g., battery discharging and charging) that the battery 122 can provide based on the temperatures it is subjected to.

As described herein, the controlled battery heat sink cooling system 154 may be used to distribute heat into the battery 122 from heat-generating hardware (e.g., CPU, hardware processor 102, GPU 152, etc.) within the base chassis 156 of the information handling system 100. To conduct heat from these heat-generating devices, the heat pipe 164 may be operatively coupled to a heat sink that is also operatively coupled to one or more of these heat-generating devices. Thus, the heat pipe 164 may conduct heat away from these devices and into the battery 122 allowing for better heat management within the base chassis 156 of the information handling system 100. In an embodiment, other or additional cooling systems may be used along with the controlled battery heat sink cooling system 154 described herein. These include fans, blowers, thermal fins, vapor chambers and the like. Each of these other cooling systems, in an embodiment, may be operating with or without the operation of the controlled battery heat sink cooling system 154. In an example embodiment, the controlled battery heat sink cooling system 154 may include a movement sensor 170 that detects the movement of the heat distribution plate 166 away from the surface of the battery 122. When triggered, this movement sensor may provide data to the hardware processor 102 or a controller associated with the PMU 120 indicating that the battery 122 is no longer being used as a heat dump and that heat may need to be controlled using other cooling systems within the base chassis 156 of the information handling system 100 such as a fan, ion emitter/collector air movement system, or other active cooling systems. In this example embodiment, the triggering of the movement sensor 170 may cause the hardware processor 102 or other processing device to turn on a fan, blower, or ion emitter/collector air movement system to evacuate and dissipate the heat within the base chassis 156. In another embodiment where the fan, blower, or ion emitter/collector air movement system are operating concurrently with the controlled battery heat sink cooling system 154 described herein, a triggering of the movement sensor 170 may cause the hardware processor 102 or other processing device to speed up movement of the fan or increase the movement of air by the blower or ion emitter/collector air movement system to compensate for the heat that is not being dissipated to the battery 122 by the heat pipe 164 and heat distribution plate 166. Deactivation of this movement sensor may, accordingly, cause the hardware processor 102 or other processing device to deactivate these other active cooling systems in order to reduce the amount of power required to operate them.

The operation of the controlled battery heat sink cooling system 154 allows for a significant increase in the cooling capacity within a base chassis 156 of an information handling system 100. Because the temperature of the battery 122 is lower than the threshold temperature most of the time during operation of the information handling system 100, the amount of heat that can be conducted into the battery 122 may be significant. In some embodiments, the heat capacity of the battery 122 may allow other cooling systems such as a fan to be shut down or suspended thereby decreasing the noise associated with the operation of such a fan. This increases user satisfaction and comfort.

The information handling system 100 can include one or more sets of machine-readable code instructions 110 that can be executed to cause the computer system to perform any one or more of the methods or computer-based functions disclosed herein. For example, machine-readable code instructions 110 may execute various software applications, software agents, a basic input/output system (BIOS) 112 firmware and/or software, or other aspects or components. Various software modules comprising application instructions 110 may be coordinated by an operating system (OS) 114, and/or via an application programming interface (API). An example OS 114 may include Windows®, Android®, and other OS types known in the art. Example APIs may include Win 32, Core Java API, or Android APIs.

The disk drive unit 118 and may include a computer-readable medium 108 in which one or more sets of machine-readable code instructions 110 such as software can be embedded to be executed by the hardware processor 102 or other processing devices such as a GPU 152 to perform the processes described herein. Similarly, main memory 104 and static memory 106 may also contain a computer-readable medium for storage of one or more sets of machine-readable code instructions, parameters, or profiles 110 described herein. The disk drive unit 118 or static memory 106 also contain space for data storage. Further, the machine-readable code instructions 110 may embody one or more of the methods as described herein. In a particular embodiment, the machine-readable code instructions, parameters, and profiles 110 may reside completely, or at least partially, within the main memory 104, the static memory 106, and/or within the disk drive 118 during execution by the hardware processor 102 or GPU 152 of information handling system 100. The main memory 104, GPU 152, and the hardware processor 102 also may include computer-readable media.

Main memory 104 or other memory of the embodiments described herein may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The applications and associated APIs, for example, may be stored in static memory 106 or on the drive unit 118 that may include access to a computer-readable medium 108 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of machine-readable code instructions. The term "computer-readable medium" shall also include any medium that is capable of storing, encoding, or carrying a set of machine-readable code instructions for execution by a hardware processor or that cause a computer system to perform any one or more of the methods or operations disclosed herein.

In an embodiment, the information handling system 100 may further include a power management unit (PMU) 120 (a.k.a. a power supply unit (PSU)). The PMU 120 may include a hardware controller and machine-readable code instructions to manage the power provided to the components of the information handling system 100 such as the hardware processing resources. The PMU 120 may also provide power to a fan cooling system that includes a fan motor and motor driver hardware, a blower, or an ion emitter/collector air movement system, and monitor the controlled battery heat sink cooling system 154, such as the movement sensor 170 according to some embodiments. The PMU 120 may control power to one or more components including one or more drive units 118, the hardware processors 102 (e.g., CPU), the GPU 152, a video/graphic display device 142 or other input/output devices 140 such as the stylus 146, a mouse 150, a keyboard 144, and a trackpad 148 and other components that may require power when a power button has been actuated by a user. In an embodiment, the PMU 120 may monitor power levels or temperature via thermistors and be electrically coupled, either wired or wirelessly, to the information handling system 100 to provide this power and coupled to bus 116 to provide or receive data or machine-readable code instructions. The PMU 120 may regulate power from a power source such as a battery 122 or A/C power adapter 124. In an embodiment, the battery 122 may be charged via the A/C power adapter 124 and provide power to the components of the information handling system 100 via a wired connections as applicable, or when A/C power from the A/C power adapter 124 is removed. PMU 120 may include a hardware controller to execute code instructions 110 of a fan control system to control the fan operation or speed of fan rotation based on feedback of the battery heat sink cooling system 154 and movement sensor 170 based on detected temperature thresholds according to embodiments of the present disclosure. PMU 120 may include a hardware controller to execute code instructions 110 of an ion emitter/collector control system to control the ion emitter/collector air movement system operation or power to the ion emitter/collector air movement system based on feedback of the battery heat sink cooling system 154 and movement sensor 170 based on detected temperature thresholds according to embodiments of the present disclosure.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or machine-readable code instructions may be stored.

In other embodiments, dedicated hardware implementations such as application specific integrated circuits (ASICs), programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses the executing software or firmware, and hardware implementations.

When referred to as a "system," a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a standalone device). The system, device, controller, or module can include hardware executing software, including firmware embedded at a device, such as an Intel® Core class processor, ARM® brand processors, Qualcomm Snapdragon processors, or other processors and chipsets, or other such device, with software capable of operating a relevant environment of the information handling system. The system, device, controller, or module can also include a combination of the foregoing examples of hardware or hardware executing software. Note that an information handling system can include an integrated circuit or a board-level product having portions thereof that can also be any combination of hardware and hardware executing software. Devices, modules, resources, controllers, or programs that are in communication with one another need not be in continuous communication with each other, unless expressly specified otherwise. In addition, devices, modules, resources, controllers, or programs that are in communication with one another can communicate directly or indirectly through one or more intermediaries.

Figure 2:
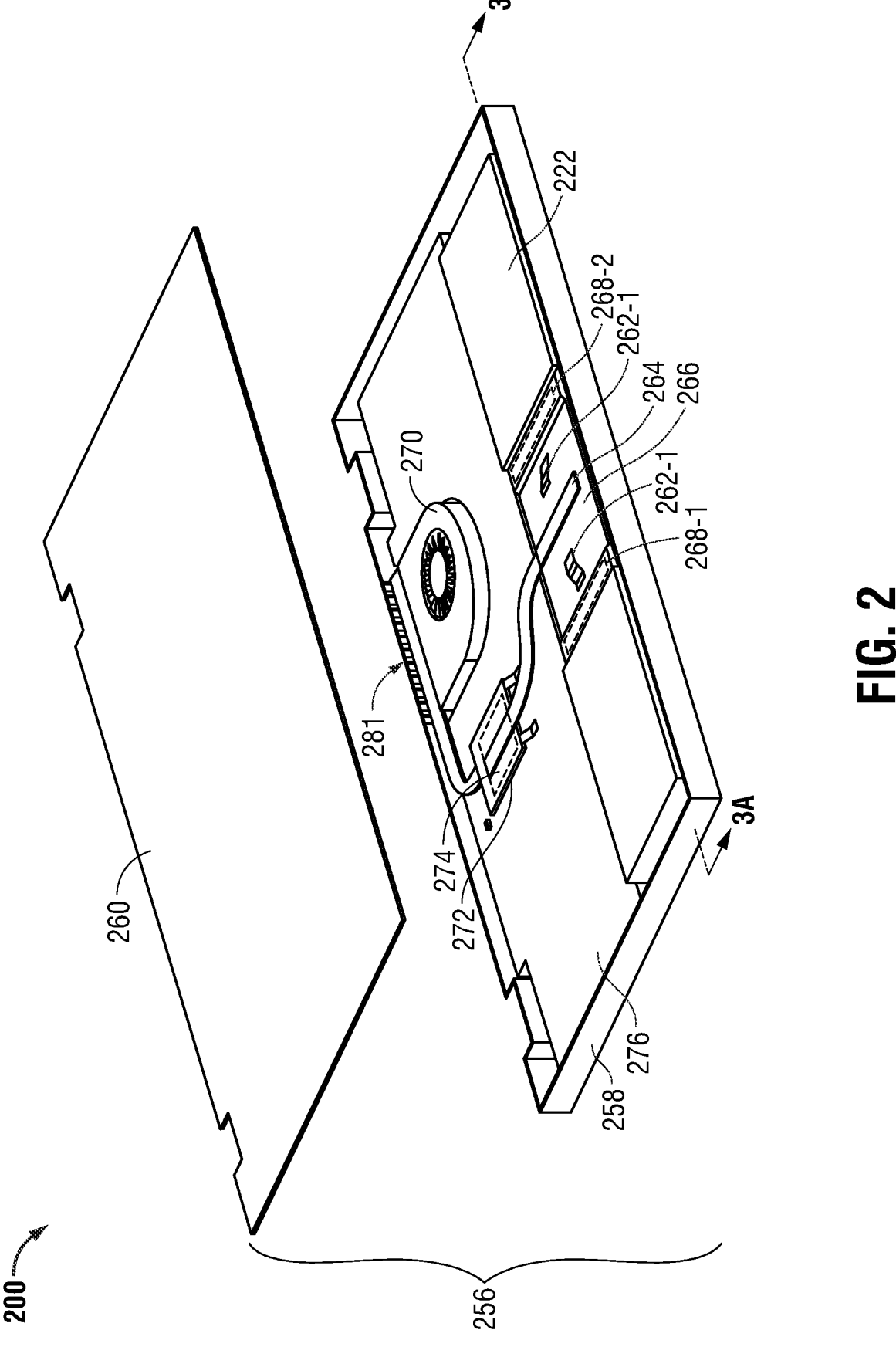
FIG. 2 is a graphic diagram perspective view of a battery heat sink controlled cooling system of an information handling system according to an embodiment of the present disclosure.

FIG. 2 is a graphic diagram perspective view of a controlled battery heat sink cooling system of an information handling system 200 according to an embodiment of the present disclosure. FIG. 2 shows a bottom cover or d-cover 260 of a chassis 256 raised off from its location to show the interior of a top cover or c-cover 258 of the base chassis 256 of the information handling system 200. Although only certain hardware is shown placed within the base chassis 256, the present specification contemplates that other hardware may be included within the base chassis 256 than what is shown in FIG. 2.

As described herein, a battery 222 may be placed within the base chassis 256 and may take up a significant portion of the space within the base chassis 256 (e.g., up to 50%). The controlled battery heat sink cooling system described herein may operate to use the battery 222 as a heat sink or dump thereby replacing or complementing the operation of other cooling systems such as the fan 270 or an ion emitter/collector air movement system.

As described herein, the controlled battery heat sink cooling system may form part of, in an embodiment, a cooling system used to cool an interior housing of the information handling system. In an example embodiment, this laptop-type information handling system 200 (a display chassis not shown in FIG. 2) includes a top cover or c-cover 258 (shown on bottom in FIG. 2) housing, for example, a keyboard, touchpad/trackpad, the battery 222, and any cover in which these components are set. The base chassis may also include a bottom cover or d-cover 260 (shown on top in FIG. 2) housing, for example, a processing device (e.g., hardware processor 102) at CPU location 274, a memory (e.g., main memory, static memory, etc.), a power management unit (PMU), wireless interface adapters and other components of the information handling system 200 for this laptop-type information handling system. In an embodiment, the portions of the controlled battery heat sink cooling system may be formed within the base chassis of the information handling system. It is contemplated that the orientation of the battery 222 and the controlled battery heat sink cooling system may be flipped between the c-cover 258 and d-cover 260 in other embodiments not shown.

The controlled battery heat sink cooling system includes a heat distribution plate 266 placed onto a surface of a battery 222. The battery 222 may be any type of battery used to provide power to the hardware associated with the information handling system 200. In an embodiment, the battery 222 may include one or more battery cells that each may be charged via a PMU and A/C power adapter (not shown) for later discharge when an A/C power adapter (not shown) is not coupled to the A/C power source. The size of the battery 222 allows the battery 222 to act as a heat sink into which heat generated from the hardware within the base chassis 256 to be conducted as described in embodiments herein. With a large thermal mass, battery 222 may absorb substantial thermal energy with a small increment of temperature. However, the amount of heat conducted into the battery 222 may be limited so that the battery 222 is not damaged from overheating.

The heat distribution plate 266 may be made of a material that can distribute heat over a portion of the surface of the battery 222 such as aluminum, copper, and the like. The heat distribution plate 266 may be operatively coupled to a first end of a heat pipe 264 on a first side of the heat distribution plate 266. This allows heat conducted by the heat pipe 264 from a heat generating hardware device such as a CPU at a CPU location 274 within the base chassis 256 of the information handling system 200 to be conducted into the heat distribution plate 266 and, via contact or other thermal coupling, into the battery 222.

Because the controlled battery heat sink cooling system heat distribution plate 266 is placed between the battery 222 and a chassis of the information handling system 200 such as a d-cover 260, the heat distribution plate 266 may be urged towards a surface of the battery 222 for proper heat distribution into the battery 222. In an embodiment, a spring 262-1 or 262-2 may be used to apply force to the heat distribution plate 266 to urge it toward the surface of the battery 222 shown underneath. In an embodiment, a first end of the springs 262-1, 262-2 may be operatively coupled or attached to an interior surface of the d-cover 260 with a second end of the springs 262-1, 262-2 pressing down onto the heat distribution plate 266 via the mechanical energy stored in the springs 262-1, 262-2. In an embodiment not shown, the first end of the springs 262-1, 262-2 may be operatively coupled or attached to an interior surface of the c-cover 258 with a second end of the springs 262-1, 262-2 pressing down onto the heat distribution plate 266 via the mechanical energy stored in the springs 262-1, 262-2. Springs 262-1, 262-2 may also be attached or otherwise operatively coupled to the heat distribution plate 266 and press against the base chassis c-cover 258 or d-cover 260 in various embodiments.

As described herein, the temperature of the battery 222 may be kept below a threshold temperature so that the battery 222 is not damaged or worn by excessive heat conducted into it by the heat distribution plate 266. To prevent damage to the battery 222 and the temperature of the battery 222 exceeding this threshold temperature, the controlled battery heat sink cooling system includes thermal switch at one or more thermal switch locations 268-1, 268-2. The thermal switches at the thermal switch locations 268-1, 268-2 may be any device that physically and thermally de-couples the heat distribution plate 266 and heat pipe 264 from thermal coupling with the surface of the battery 222. In an embodiment, the thermal switches may physically overcome the mechanical energy imparted by the springs 262-1, 262-2 onto the heat distribution plate 266 in order to physically lift the heat distribution plate 266 from thermal coupling with the surface of the battery 222. In an embodiment, the thermal switches have material properties that physically lift the heat distribution plate 266 off the battery 222 at or near the threshold temperature so that heat damage does not occur at the battery 222.

In an embodiment, the thermal switches at switch locations 268-1, 268-2 may be one or more paraffin wax bags. In an embodiment, the paraffin wax may be housed within a bag made of, for example, plastic or a metal such as aluminum. The paraffin wax bag may be operatively coupled to a second side (e.g., an underside) of the heat distribution plate 266 at thermal switch locations 268-1, 268-2 such that the paraffin wax bag is between a portion of the heat distribution plate 266 and the battery 222. In an embodiment, the paraffin wax within the paraffin wax bag may have a melting point at or near the threshold temperature such that the paraffin wax melts and increases or expands its size. As the size of the paraffin wax increases, the paraffin wax bag may begin to lift the heat distribution plate 266 from thermal coupling with the surface of the battery 222 thermally de-coupling the battery 222 thereby limiting or preventing heat at the heat distribution plate 266 from being conducted into the battery 222. This prevents damage to the battery 222 while still allowing for heat to be conducted into the battery 222 when the temperature threshold has not yet been reached. In an embodiment, the temperature threshold may be set to 50° C. (~122° F.) (±5°) to prevent damage to the battery 222 and the paraffin wax within the paraffin wax bag may be formulated to melt and expand at or near this temperature threshold. When the temperature at the heat distribution plate 266 or the battery 222 drops below the temperature threshold, the paraffin wax within the paraffin wax bag may solidify, coagulate, or otherwise return to its original and smaller state allowing the heat distribution plate 266 to be urged again onto the surface of the battery 222 via the spring 262. This allows heat to once again be conducted into the battery 222. In one embodiment, the threshold temperature may be set based on a cycle life target of the battery 222. For example, a threshold temperature may be based on an anticipated lifetime number of cycles (e.g., battery discharging and charging) that the battery 222 can provide operating at or below particular temperature levels it is subjected to.

In an embodiment, the thermal switches placed at the thermal switch locations 268-1, 268-2 may be a shape-memory alloy structure that changes shape when heat is applied to it. In this embodiment, the shape-memory alloy may be made of any type of metal alloys such as copper-aluminum-nickel alloys and nickel-titanium alloys among others. These shape-memory alloys may, in an embodiment, be a two-way shape-memory alloy that has two different and stable shapes: one at a temperature below a threshold temperature and one above that threshold temperature. In an embodiment, this two-way shape-memory alloy may have a first shape at a temperature below the threshold temperature that allows the heat distribution plate 266 to come into contact or otherwise thermally couple with a surface of the battery 222. In an embodiment, this two-way shape-memory alloy may have a second shape at a temperature above the threshold temperature that, due to the change in shape, raises the heat distribution plate 266 off from the surface of the battery 222. Again, in an embodiment, the alloys of the two-way shape-memory alloy may be selected to change from this first shape to the second shape at a threshold temperature such as at 50° C. (~122° F.) (±5°) in one embodiment. This prevents excessive heat from damaging the battery 222 while allowing heat to be conducted into the battery 222 when the threshold temperature has not been reached. In an embodiment, the threshold temperature may be set based on a cycle life target of the battery 222. For example, a threshold temperature may be based on an anticipated lifetime number of cycles (e.g., battery discharging and charging) that the battery 222 can provide operating below a particular temperature that it is subjected to.

FIG. 2 shows a placement of a thermal switch at a thermal switch location 268-1, 268-2 under raised portions of the heat distribution plate 266. In an embodiment, these raised portions of the heat distribution plate 266 may be formed at the edges of the heat distribution plate 266, but the present specification contemplates that these thermal switch locations 268-1, 268-2 may be at any location between the heat distribution plate 266 and battery 222 such that as the temperature threshold is reached, the thermal switch can move the heat distribution plate 266 from off a surface of the battery 222 to thermally de-couple the battery 222.

As described herein, the controlled battery heat sink cooling system may be used to distribute heat into the battery 222 from heat-generating hardware (e.g., CPU at CPU location 274, hardware processor, GPU, etc.) within the base chassis 256 of the information handling system 200. To conduct heat from these heat-generating devices, the heat pipe 264 may be operatively coupled to a heat sink 272 that is also operatively coupled to one or more of these heat-generating devices. Thus, the heat pipe 264 may conduct heat away from these devices and into the battery 222 allowing for better heat management within the base chassis 256 of the information handling system 200. In an embodiment, other or additional cooling systems may be used along with the controlled battery heat sink cooling system described herein. These include fans 270, blowers, ion emitter/collector air movement system, thermal fins, vapor chambers and the like. These other systems, passive or active, may be operatively coupled to heat pipe 264 as well in some embodiments. Each of these other cooling systems, in an embodiment, may be operating with or without the operation of the battery heat sink cooling system. In the embodiment shown in FIG. 2, the heat pipe 264 may extend from the heat sink 272 and towards an exhaust vent of a fan 270 or other active cooling system with a passive cooling thermal fin set so that heat at the CPU location 274 can be conducted towards the fan 270 and an external vent 281 in the base chassis 256 as well as towards the heat distribution plate 266 as described herein.

In an example embodiment, the controlled battery heat sink cooling system may include a movement sensor (not shown) that detects the movement of the heat distribution plate 266 away from the surface of the battery 222. When triggered, this movement sensor may provide data to the hardware processor or a hardware controller associated with the PMU indicating that the battery 222 is no longer being used as a heat dump and that heat may need to be controlled using other cooling systems within the base chassis 256 of the information handling system 200 such as the fan 270 or other active cooling systems. In this example embodiment, the triggering of the movement sensor may cause the hardware processor or other processing device to turn on the fan 270 to evacuate and dissipate the heat within the base chassis 256 or cool thermal fins at fan 270 and exhaust vent 281. In another embodiment where the fan 270 is operating concurrently with the controlled battery heat sink cooling system described herein, a triggering of the movement sensor may cause the hardware processor or other processing device to speed up movement of the fan to compensate for the heat that is not being dissipated at the battery 222 by the heat pipe 264 and heat distribution plate 266. Deactivation of this movement sensor may, accordingly, cause the hardware processor or other hardware processing device to deactivate or reduce the speed of these other active cooling systems in order to reduce the amount of power required to operate them. Fan 270 in some embodiments may instead be an ion emitter/collector air movement system.

The operation of the controlled battery heat sink cooling system allows for a significant increase in the cooling capacity within a base chassis of an information handling system 200. Because the temperature of the battery 222 is lower than the threshold temperature most of the time during operation of the information handling system 200, the amount of heat that can be conducted into the battery 222 may be significant. In some embodiments, the heat capacity of the battery 222 may allow other cooling systems such as a fan to be shut down thereby decreasing the noise associated with the operation of such a fan. This increases user satisfaction during operation.

Figures 3A, 3B:
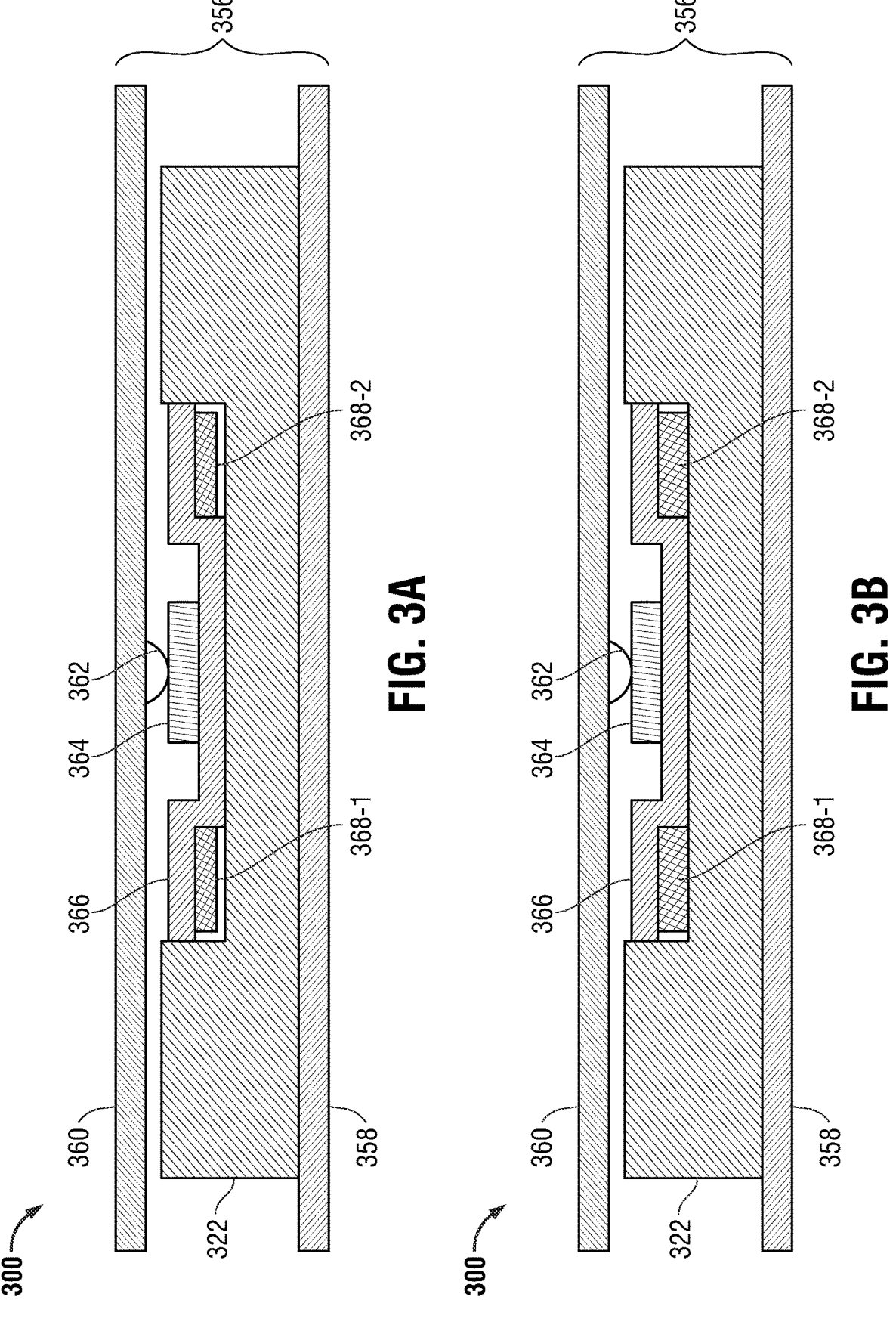
FIG. 3A is a graphic diagram side, cut-out view of a controlled battery heat sink cooling system with a thermal switch in a first state according to an embodiment of the present disclosure.
FIG. 3B is a graphic diagram side, cut-out view of a controlled battery heat sink cooling system with a thermal switch in a second state according to another embodiment of the present disclosure.

FIG. 3A is a graphic diagram side, cut-out view of a controlled battery heat sink cooling system with thermal switches 368-1, 368-2 in a first state according to an embodiment of the present disclosure. In this example embodiment, FIG. 3 shows that the thermal switches 368-1, 368-2 as including a paraffin wax bag. However, it is appreciated that any thermal switch 368-1, 368-2 may be used including the shape-memory alloy embodiments described herein.

FIG. 3A shows the controlled battery heat sink cooling system being placed between a c-cover 358 under which a battery 322 is mounted and d-cover 360 of the base chassis 356. In FIG. 3A, the battery 322 is shown to be operatively coupled to the c-cover 358 however, the present specification contemplates that the battery 322 may be operatively coupled to the d-cover 360 and the controlled battery heat sink cooling system may be flipped with respect to the c-cover 358 and d-cover 360 than that shown in FIG. 3A in other embodiments.

In an embodiment, the battery 322 may be any type of battery used to provide power to the hardware associated with the information handling system 300. In an embodiment, the battery 322 may include one or more battery cells that each may be charged via a PMU and A/C power adapter for later discharge when the A/C power adapter is not coupled to an A/C power source. In an embodiment, the size of the battery 322 may take up as much as 50% of the space within the base chassis 156 of the information handling system 300. The battery 322 has a large thermal mass as well. This allows the battery 322 to act as a heat sink into which heat generated from the hardware within the base chassis 356 can be dumped to limit temperature increases. However, the amount of heat conducted into the battery 322 may be limited so that the battery 322 is not damaged or worn from overheating.

The heat distribution plate 366 shown in FIG. 3A shows that a portion of the heat distribution plate 366 is thermally coupled to the battery 322. In an embodiment, the heat distribution plate 366 may be abutting a top surface of the battery 322. In other embodiments, a thermal coupling structure such as a thermal gasket, thermal spreader or other passive thermal structures may thermally couple the heat distribution plate 366 to the battery 322. The heat distribution plate 366 may also include a stepped wing to which the thermal switches 368-1, 368-2 are coupled such as on a bottom (e.g., second) side of the heat distribution plate 366 as shown in FIG. 3A. In this embodiment, the thermal switches 368-1, 368-2 are operatively coupled to an underside of these stepped wings placing the thermal switches 368-1, 368-2 in a position between the underside of the heat distribution plate 366 and the surface of the battery 322.

The heat distribution plate 366 may be operatively coupled to a first end of a heat pipe 364 on a first side of the heat distribution plate 366. This allows heat conducted by the heat pipe 364 from a heat generating hardware device within the base chassis 356 of the information handling system 300 to be transferred into the heat distribution plate 366 and, via thermal coupling such as contact, into the battery 322.

In an embodiment, a spring 362 may be used to apply force to urge the heat pipe 364 and heat distribution plate 366 onto the surface of the battery 322. In an embodiment, a first end of the spring 362 may be operatively coupled to an interior surface of the c-cover 358 with a second end of the spring 362 pressing down onto the heat pipe 364 and heat distribution plate 366 via the mechanical energy stored in the spring 362. In other embodiments, one or more springs 362 may press down onto the heat distribution plate 366 more directly (e.g., to one side or the other of the heat pipe 364). Again, it is anticipated that the placement of the controlled battery heat sink cooling system and battery 322 may be reversed with respect to the c-cover 358 and d-cover 360 placed in opposite positions with the battery 322 operatively coupled to the d-cover 360 and spring 362 operatively coupled to the c-cover in other embodiments.

FIG. 3B is a graphic diagram side, cut-out view of a controlled battery heat sink cooling system with a heat-expanding device in a second state according to another embodiment of the present disclosure. FIG. 3B is, in an embodiment, a diagram showing the thermal switches 368-1, 368-2 in a different state than that shown in FIG. 3A and after the temperature threshold has been reached.

As described herein, the thermal switches 368-1, 368-2 are paraffin wax bags in this embodiment. However, the present specification contemplates that any thermal switch 368-1 or combination of different types of thermal switches 368-1, 368-2, 368-2 may be used to thermally de-couple the heat distribution plate 366 from thermal coupling with the surface of the battery 322 when the temperature threshold has been reached.

In the embodiments shown in FIGS. 3A and 3B, the paraffin wax may be housed within a bag made of, for example, plastic or a metal such as aluminum. The paraffin wax bag may be operatively coupled to a second side (e.g., an underside in the orientation shown) of the heat distribution plate 366 such that the paraffin wax bag is between a portion of the heat distribution plate 366 and the battery 322. In an embodiment, the paraffin wax within the paraffin wax bag may have a melting point at or near the threshold temperature such that the paraffin wax melts and increases its size as shown in FIG. 3B. As the size of the paraffin wax increases, the paraffin wax bag may expand and begin to lift the heat distribution plate 366 from thermal coupling with the surface of the battery 322 to thermally de-couple the battery 322 thereby limiting or preventing heat at the heat distribution plate 366 from being conducted into the battery 322. This prevents damage or wear to the battery 322 while still allowing for heat to be conducted into the battery 322 when the temperature threshold is not reached as shown in FIG. 3A. In an embodiment, the temperature threshold may be set to 50° C. (~122° F.) (±5°) to prevent damage or wear to the battery 322 and the paraffin wax within the paraffin wax bag may be formulated to melt and expand at or near this temperature threshold. When the temperature at the heat distribution plate 366 or battery 322 drops below the temperature threshold, the paraffin wax within the paraffin wax bag may solidify, coagulate, or otherwise return to its original and smaller state (e.g., the state shown in FIG. 3A) allowing the heat distribution plate 366 to be thermally coupled again onto the surface of the battery 322 via the spring 362. This allows heat to once again be conducted into the battery 322. In an embodiment, the threshold temperature may be set based on a cycle life target of the battery 322. For example, a threshold temperature may be based on an anticipated lifetime number of cycles (e.g., battery discharging and charging) that the battery 322 can provide based on operation at or below particular temperatures that it is subjected to.

In an embodiment, the thermal switches 368-1, 368-2 may be a shape-memory alloy structure that changes shape when heat is applied to it. In this embodiment, the shape-memory alloy may be made of any type of metal alloys such as copper-aluminum-nickel alloys and nickel-titanium alloys among others. These shape-memory alloys may, in an embodiment, be a two-way shape-memory alloy that has two different and stable shapes: one at a temperature below a threshold temperature and one above that threshold temperature. In an embodiment, this two-way shape-memory alloy may have a first shape at a temperature below the threshold temperature that allows the heat distribution plate 366 to come into contact or otherwise thermally couple with a surface of the battery 322. In an embodiment, this two-way shape-memory alloy may have a second shape at a temperature above the threshold temperature that raises the heat distribution plate 366 off from the surface of the battery 322 to thermally de-couple battery 322 as shown in FIG. 3B. Again, in an embodiment, the alloys of the two-way shape-memory alloy may be selected to change from this first shape to the second shape at a threshold temperature such as 50° C. (~122° F.) (±5°). This prevents excessive heat from damaging the battery 322 while allowing heat to be conducted into the battery 322 when the threshold temperature has not been reached. In an embodiment, the threshold temperature may be set based on a cycle life target of the battery 322. For example, a threshold temperature may be based on an anticipated lifetime number of cycles (e.g., battery discharging and charging) that the battery 322 can provide operating at or below particular temperatures that it is subjected to.

Again, in an example embodiment, the controlled battery heat sink cooling system may include a movement sensor (not shown) that detects the movement of the heat distribution plate 366 away from the surface of the battery 322. When triggered, this movement sensor may provide data to the hardware processor or a hardware controller associated with the PMU indicating that the battery 322 is no longer being used as a heat dump and that heat may need to be controlled using other cooling systems within the base chassis 356 of the information handling system 300 such as a fan, ion emitter/collector air movement system, or other active cooling systems. In this example embodiment, the triggering of the movement sensor may cause the hardware processor or other hardware processing device to turn on a fan, ion emitter/collector air movement system, or blower to evacuate and dissipate the heat within the base chassis 356. In another embodiment where the fan, ion emitter/collector air movement system, or blower are operating concurrently with the controlled battery heat sink cooling system described herein, a triggering of the movement sensor may cause the hardware processor or other hardware processing device to speed up movement of the fan or increase the movement of air by the ion emitter/collector air movement system or blower to compensate for the heat that is not being dissipated at the battery 322 by the heat pipe 364 and heat distribution plate 366. Deactivation of this movement sensor may, accordingly, cause the hardware processor or other processing device to deactivate or throttle down these other active cooling systems in order to reduce the amount of power required to operate them.

Figure 4:
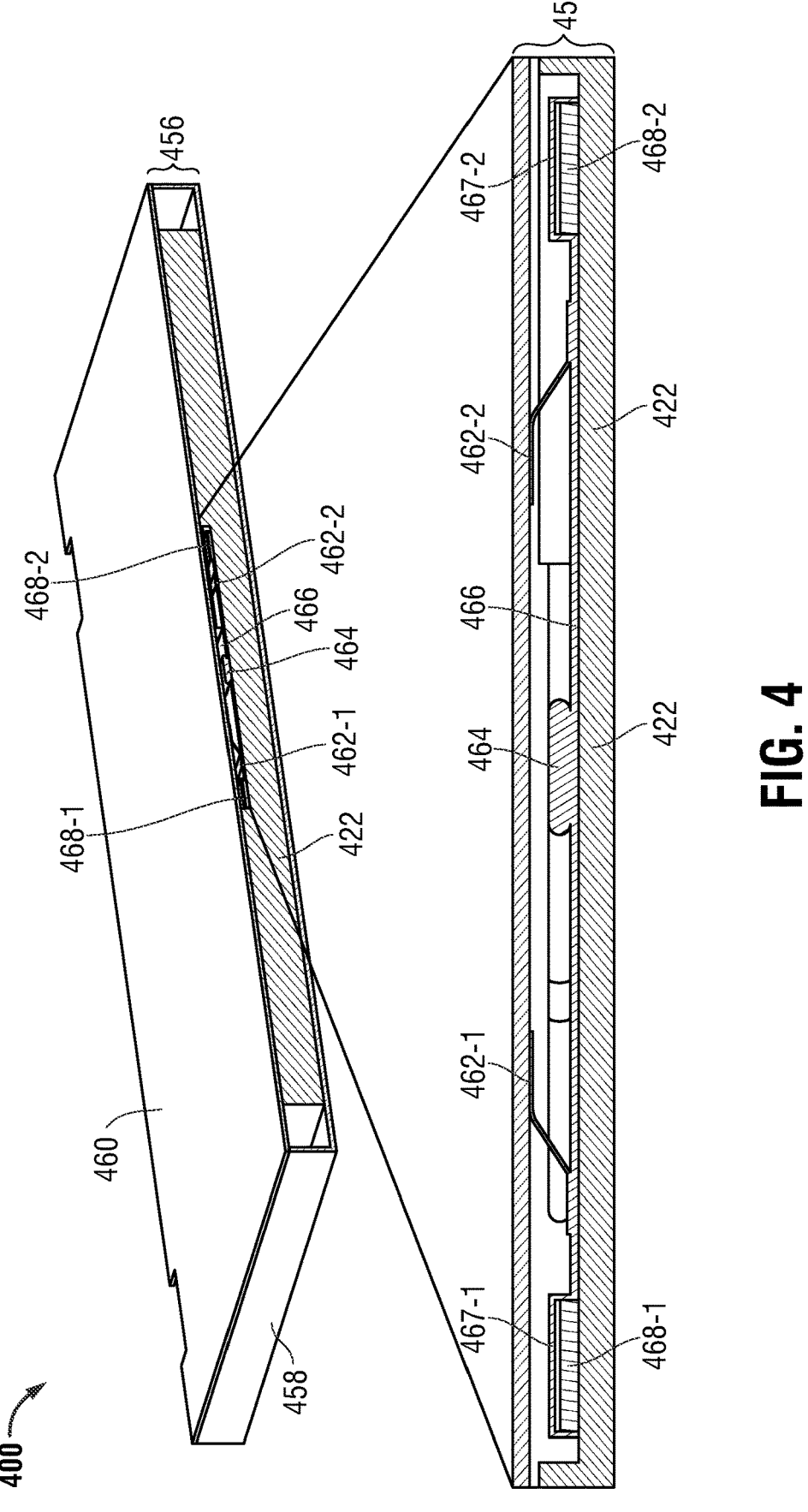
FIG. 4 is a graphic diagram perspective view of a controlled battery heat sink cooling system housed within a chassis of an information handling system with a close-up, side, cut-out view of the controlled battery heat sink cooling system of an information handling system according to an embodiment of the present disclosure.

FIG. 4 is a graphic diagram perspective view of a controlled battery heat sink cooling system housed within a chassis 456 of an information handling system and a close-up, side, cut-out view of the controlled battery heat sink cooling system of an information handling system 400 according to an embodiment of the present disclosure. Similar to FIGS. 2, 3A, and 3B, FIG. 4 shows a base chassis 456 having a top or c-cover 458 and bottom or d-cover 460 with the c-cover 458 facing down that houses the controlled battery heat sink cooling system described herein. The controlled battery heat sink cooling system includes a heat pipe 464 operatively coupled, at a first end of the heat pipe 464, to a first side of the heat distribution plate 466. A portion of the second side of the heat distribution plate 466 may be placed against a surface of the battery 422.

In this example embodiment, FIG. 4 shows that the thermal switches 468-1, 468-2 as including a paraffin wax bag. However, it is appreciated that any thermal switch 468-1, 468-2 may be used including the shape-memory alloy embodiments described herein. In FIG. 4, the paraffin wax bag thermal switches 468-1, 468-2 are placed under a winged portions 467-1, 467-2 of the heat distribution plate 466 and operatively coupled to a second side of the heat distribution plate 466. FIG. 4 shows that in an embodiment, the winged portions 467-1, 467-2 of the heat distribution plate 466 wraps around a top and side surfaces of the paraffin wax bag thermal switches 468-1, 468-2. FIG. 4 shows the paraffin wax bag thermal switches 468-1, 468-2 in a solid state with the paraffin wax bag thermal switches 468-1, 468-2 not applying a force against the battery 422 and an underside of the heat distribution plate 466. It is appreciated, as described herein, the application of heat to the heat distribution plate 466 and battery 422 above a temperature threshold causes the paraffin wax in the paraffin wax bag thermal switches 468-1, 468-2 to melt and expand causing the heat distribution plate 466 to be separated from the battery 422 during operation to thermally de-couple the battery 422.

In the example shown in FIG. 4, the springs 462-1, 462-2 may be operatively coupled to the top side (e.g., first side) of the heat distribution plate 466 at a first end of the spring 462-1, 462-2. These springs 462-1, 462-2 may apply force to urge the heat pipe 464 and heat distribution plate 466 against the battery 422 to thermally couple the battery 422 due to a second end of the springs 462-1, 462-2 being urged against an interior side of the d-cover 460 as shown. In an embodiment, the springs 462-1, 462-2 may be leaf springs.

During operation, the paraffin wax of the paraffin wax bag thermal switches 468-1, 468-2 may be formulated to melt at a specific temperature threshold such as a temperature of around 50° C. (±5°). When such a threshold temperature is reached, the paraffin wax of the paraffin wax bag thermal switches 468-1, 468-2 melts and expands which, in turn, thermally de-couples the heat distribution plate 466 from a surface of the battery 422. In an embodiment, the paraffin wax bag thermal switches 468-1, 468-2 may expand to around 15% of its solid state when the threshold temperature is reached. This prevents damage or wear to the battery 422 from overheating while, when the threshold temperature is not reached, allowing the controlled battery heat sink cooling system to use the thermal mass of the battery 422 as a heat sink from the heat pipe 464.

Figure 5:
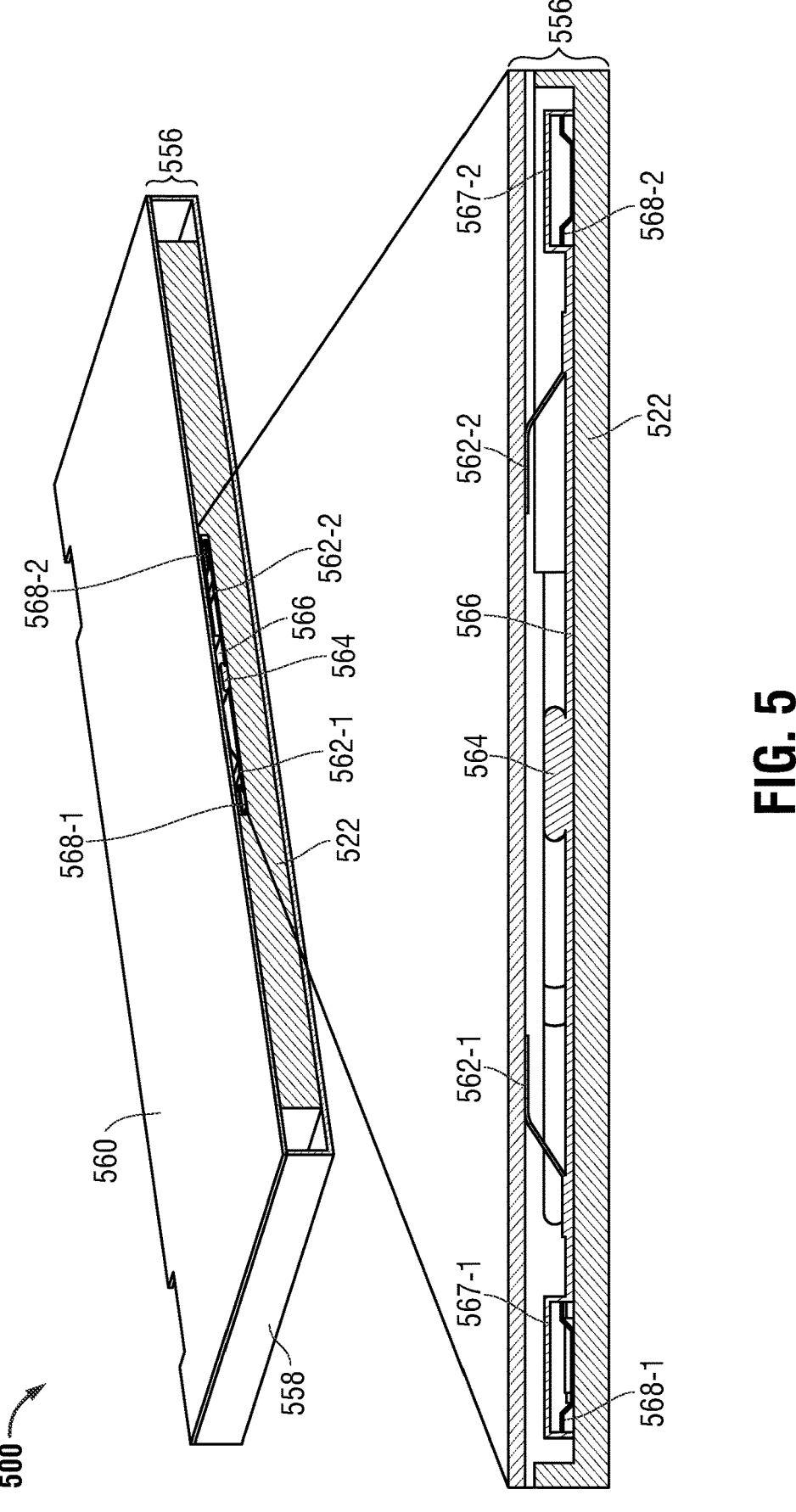
FIG. 5 is a graphic diagram perspective view of a controlled battery heat sink cooling system housed within a chassis of an information handling system with a close-up, side, cut-out view of the controlled battery heat sink cooling system of an information handling system according to another embodiment of the present disclosure.

FIG. 5 is a graphic diagram perspective view of a controlled battery heat sink cooling system housed within a base chassis 456 of an information handling system 500 and a close-up, side, cut-out view of the controlled battery heat sink cooling system of an information handling system 500 according to another embodiment of the present disclosure. Similar to FIGS. 2, 3A, 3B, and 4, FIG. 5 shows a base chassis 556 having a top cover or c-cover 558 and bottom cover or d-cover 560 with the c-cover 558 facing down that houses the controlled battery heat sink cooling system described herein. The controlled battery heat sink cooling system includes a heat pipe 564 operatively coupled, at a first end of the heat pipe 564, to a first side of the heat distribution plate 566. A portion of the second side of the heat distribution plate 566 may be placed against a surface of the battery 522.

In the example, embodiment in FIG. 5, the thermal switches 568-1, 568-2 are shape-memory alloy thermal switches 568-1, 568-2 that change shape when heat is applied to it. In this embodiment, the shape-memory alloy may be made of any type of metal alloys such as copper-aluminum-nickel alloys and nickel-titanium alloys among others. These shape-memory alloys may, in an embodiment, be a two-way shape-memory alloy that has two different and stable shapes: one at a temperature below a threshold temperature and one above that threshold temperature. In an embodiment, this two-way shape-memory alloy may have a first shape at a temperature below the threshold temperature that allows the heat distribution plate 566 to come into contact with a surface of the battery 522 to thermally couple the battery 522. In an embodiment, this two-way shape-memory alloy may have a second shape at a temperature above the threshold temperature that raises the heat distribution plate 566 off from the surface of the battery 522 to thermally de-couple the battery 522. Again, in an embodiment, the alloys of the two-way shape-memory alloy may be selected to change from this first shape to the second shape at a threshold temperature such as 50° C. (~122° F.) (±5°). This prevents excessive heat from damaging the battery 522 while allowing heat to be conducted into the battery 522 when the threshold temperature has not been reached. In an embodiment, the threshold temperature may be set based on a cycle life target of the battery 522. For example, a threshold temperature may be based on an anticipated lifetime number of cycles (e.g., battery discharging and charging) that the battery 522 can provide based at or below particular temperatures it is subjected to. In an embodiment, the shape-memory alloy thermal switches 568-1, 568-2 are placed under a winged portion 567-1, 567-2 of the heat distribution plate 566 and operatively coupled to a second side of the heat distribution plate 566.

In the example shown in FIG. 5, the springs 562-1, 562-2 may be operatively coupled to the top side (e.g., first side) of the heat distribution plate 566 at a first end of the spring 562-1, 562-2. These springs 562-1, 562-2 may be force the heat pipe 564 and heat distribution plate 566 against the battery 522 due to a second end of the springs 562-1, 562-2 being urged against an interior side of the d-cover 560 as shown. In an embodiment, the springs 562-1, 562-2 may be leaf springs.

The steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps, or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
a processor;
a memory device;
a power management unit (PMU) to provide power to the processor and memory device;
a battery operatively coupled to the PMU;
a controlled battery heat sink cooling system, the battery heat sink cooling system including:
    a heat distribution plate thermally coupled to a surface of the battery;
    a heat pipe operatively coupled to a first side of the heat distribution plate at a first end of the heat pipe, a second end of the heat pipe operatively coupled to heat generating hardware component within the information handling system to conduct heat from the heat generating hardware component to the heat distribution plate;
    a spring operatively coupled to the heat distribution plate to produce a force to urge the heat distribution plate to thermally couple to the battery; and
    a thermal switch operatively coupled to a second side of the heat distribution plate to, when heated to a temperature threshold, expand to thermally de-couple the heat distribution plate from the battery.

2. The information handling system of claim 1 further comprising:
the thermal switch including a paraffin wax bag wherein a paraffin wax inside the paraffin wax bag melts at the temperature threshold and expands to thermally de-couple the heat distribution plate from the battery.

3. The information handling system of claim 2, wherein the paraffin wax bag expands from its solid state when the temperature threshold is reached.

4. The information handling system of claim 1 further comprising:
the thermal switch including a shape-memory alloy that changes shape when the shape-memory alloy reaches the temperature threshold, the change in shape thermally de-coupling the heat distribution plate from the battery.

5. The information handling system of claim 1 further comprising:
the temperature threshold corresponds to a battery operating temperature below which a battery cycle target of at least 2000 cycles is enabled.

6. The information handling system of claim 1 further comprising:
a movement sensor to determine when the thermal switch has expanded to thermally de-couple the heat distribution plate from the battery.

7. The information handling system of claim 6 further comprising:
a fan operatively coupled in the information handling system, wherein when the movement sensor determines when the thermal switch has expanded, a controller increases a rotational speed of the fan to decrease the heat at the heat generating hardware.

8. The information handling system of claim 1 wherein the spring is operatively coupled to the heat pipe and heat distribution plate to urge the heat distribution plate to contact a surface of the battery for thermal coupling.

9. A controlled battery heat sink cooling system for an information handling system comprising:

a heat distribution plate thermally coupled to a surface of a battery that is operatively coupled to a power management unit (PMU);

a heat pipe operatively coupled to a first side of the heat distribution plate at a first end of the heat pipe, a second end of the heat pipe operatively coupled to heat generating hardware within the information handling system to conduct heat from the heat generating hardware to the heat distribution plate;

a spring operatively coupled between a base chassis of the information handling system and the heat distribution plate to urge the heat distribution plate and towards the battery for the heat distribution plate to thermally couple to the battery; and a thermal switch operatively coupled to a second side of the heat distribution plate to, when heated to a temperature threshold, expand to thermally de-couple the heat distribution plate from the battery.

10. The controlled battery heat sink cooling system of claim 9 further comprising:

the thermal switch including a paraffin wax bag wherein the paraffin wax melts at the temperature threshold and expands to thermally de-couple the heat distribution plate from the battery.

11. The controlled battery heat sink cooling system of claim 10, wherein the temperature threshold is 50° C.+/−5° C.

12. The controlled battery heat sink cooling system of claim 9 further comprising:

the thermal switch including a shape-memory alloy that changes shape when the shape-memory alloy reaches the temperature threshold, the change in shape thermally de-coupling the heat distribution plate from the battery.

13. The controlled battery heat sink cooling system of claim 9 further comprising:

the temperature threshold corresponds to a battery operating temperature such that a battery cycle target of at least 2000 cycles is enabled.

14. The controlled battery heat sink cooling system of claim 9 further comprising:

a movement sensor to determine when the thermal switch has expanded to selectively remove the heat distribution plate from the battery.

15. The controlled battery heat sink cooling system of claim 14 further comprising:

a fan operatively coupled to the base chassis to, when the movement sensor determines when the thermal switch has expanded, turn on to decrease the heat at the heat generating hardware.

16. The controlled battery heat sink cooling system of claim 9 further comprising:

a heat sink operatively coupled to the heat pipe to conduct heat from the heat generating hardware into the heat pipe and to the heat distribution plate.

17. A controlled battery heat sink cooling system of an information handling system comprising:

a heat distribution plate thermally coupled to a surface of a battery that is operatively coupled to a power management unit (PMU);

a heat pipe operatively coupled to a first side of the heat distribution plate at a first end of the heat pipe, a second end of the heat pipe operatively coupled to heat generating hardware within the information handling system to conduct heat from the heat generating hardware to the heat distribution plate;

a spring operatively coupled to the heat pipe to produce a force against the heat pipe and urge the heat distribution plate towards the battery to thermally couple the heat distribution plate to the battery; and a thermal switch operatively coupled to a second side of the heat distribution plate to, when heated to a temperature threshold, thermally de-couple the heat distribution plate from the surface of the battery.

18. The controlled battery heat sink cooling system of claim 17, wherein the thermal switch is a shape-memory alloy that changes shape when the shape-memory alloy reaches the temperature threshold, the change in shape to thermally de-couple the heat distribution plate from the battery.

19. The controlled battery heat sink cooling system of claim 17, wherein the thermal switch is a paraffin wax bag where paraffin wax inside the paraffin wax bag melts at the threshold temperature and expands to thermally de-couple the heat distribution plate from the battery.

20. The controlled battery heat sink cooling system of claim 17 further comprising:

a movement sensor to determine when the thermal switch has expanded to selectively remove the heat distribution plate from the battery; and a controller to turn on an active cooling system when the movement sensor detects that the thermal switch has expanded.

* * * * *